United States Patent [19]
Kawashima et al.

[11] Patent Number: 4,744,058
[45] Date of Patent: May 10, 1988

[54] SEMICONDUCTOR PROGRAMMABLE MEMORY DEVICE AND METHOD OF WRITING A PREDETERMINED PATTERN TO SAME

[75] Inventors: Hiromi Kawashima, Kawasaki; Hideki Arakawa, Yokohama, both of Japan

[73] Assignee: Fujitsu Limited, Kawasaki, Japan

[21] Appl. No.: 930,399

[22] Filed: Nov. 14, 1986

[30] Foreign Application Priority Data

Nov. 20, 1985 [JP] Japan ................................. 60-260493

[51] Int. Cl.[4] ............................................. G11C 13/00
[52] U.S. Cl. ..................................... 365/189; 365/200
[58] Field of Search ........................ 365/189, 230, 200

[56] References Cited

U.S. PATENT DOCUMENTS 4,613,957  9/1986  Iwahashi ............................ 365/207

Primary Examiner—Terrell W. Fears
Attorney, Agent, or Firm—Staas & Halsey

[57] ABSTRACT

A semiconductor programmable memory device, especially an E²PROM, in which a checkerboard pattern for testing the operation of the memory matrix is easily written. The E²PROM is provided with a circuit which can select all of the word lines or every other word line at the same time, and which can simultaneously select all of the bit lines. This circuit reduces the number of steps required to write a checkerboard pattern in the memory matrix to only four, regardless of the memory size. Therefore, the process time to write the checkerboard pattern is reduced to approximately 40 m sec, which is equivalent to the time required to write four bytes in the memory matrix.

12 Claims, 6 Drawing Sheets

SEMICONDUCTOR PROGRAMMABLE MEMORY DEVICE AND METHOD OF WRITING A PREDETERMINED PATTERN TO SAME

BACKGROUND OF THE INVENTION

The present invention relates to a semiconductor programmable memory device, and especially to an electrically erasable programmable read only memory (abbreviated as EEPROM or E²PROM) device. The present invention is directed to a circuit configuration which reduces the time required to check the performance of the E²PROM.

A semiconductor memory device is tested by writing a predetermined pattern, such as a checkerboard pattern, in its memory matrix, and reading it out. The checkerboard pattern is composed of "1"s and "0"s written alternately in each of the memory cells, and as a whole, the memory matrix is patterned like a checkerboard.

The read out process of an E²PROM is performed very quickly, however, the writing process into a memory cell of the E²PROM takes a long time. For example, it takes approximately 10 ms to write or erase a byte, so that it takes more than a minute to "write" the checker pattern in a 64 k-bit E²PROM. Therefore, as the memory size becomes large, the time required to write in a checkerboard pattern (and hence the testing time) becomes very long.

In order to clearly disclose the advantages of the present invention, the structure and working process of a prior art E²PROM will be described briefly. FIG. 1 shows schematically a cross-sectional view of a memory transistor used in a memory cell of an E²PROM. S and D indicate, respectively, a source and drain of an n-channel floating gate memory cell, CG is a control gate, and FG is a floating gate. In the E²PROM, when electrons are accumulated in the floating gate FG, the memory transistor is cut off. This process is called an "erase" operation and a datum "1" is written in the memory cell. When the electrons are discharged from the floating gate FG, the memory transistor switches to an ON state. This process is called a "write" operation, and a datum "0" is written in the memory cell.

In the structure of the memory cell of FIG. 1, the isolation layer IL between the floating gate FG and the drain D is fabricated very thin. Thus, electrons can pass through the isolation layer IL, due to the tunnel effect, when a high voltage is applied between the floating gate FG and the drain D. In order to perform the "erase" operation in a memory cell, a high voltage Vpp (21 volts for example) is applied to the control gate CG, and the voltage of the drain D is kept at 0 volts. The voltage of the floating gate FG is increased due to a coupling capacity between both gates and, therefore, electrons are injected from the drain D into the floating gate FG by the tunnel effect, and a datum "1" is written in the memory cell.

In order to perform the "write" operation, the voltage of the control gate CG is kept at 0 volts, and a high voltage Vpp is applied to the drain D. As a result, the electrons on the floating gate FG are discharged to the drain D by the tunnel effect, and a datum "0" is written in the memory cell.

FIG. 2 is a circuit diagram of a conventional E²PROM for showing a process relevant to the present invention. A fundamental process for writing data in the memory cells of a prior art E²PROM device will be explained briefly with reference to FIG. 2. The description will be given, as an example, with respect to a memory matrix with a byte made up of 8 bits. In the figure, word lines WL1, WL2 ... WLn are arranged in a horizontal direction, and bit lines BL are arranged in a vertical direction. At each cross point of the word lines and the bit lines, a memory cell 2 is provided. Each of the memory cells 2 includes a memory transistor having a floating gate, and a MOS-FET (metal-oxide-semiconductor type field effect transistor). Each eight memory cells on a word line form a memory array 1 for one byte composed of eight bits.

In order to control the eight memory cells of each byte, a gate-controlling transistor 4 is provided to each memory array 1. Gate-controlling transistor 4 controls the voltage of the control gates of each memory transistor. The gate of each gate-controlling transistor 4 is also connected to the respective word line of the memory array which it controls.

As can be seen in FIG. 2, the memory arrays 1 are arranged in several columns, and data input lines Di1, Di2 ... Di8 are connected in parallel to each column and include the bit lines BL. On each of the bit lines BL is provided a transistor 3. The gates of the transistors 3 in each column are connected to each other. The group of transistors 3 corresponding to each column form respectively the Y-gates Y1, Y2 ... Yn. In the description hereinafter, the control signals to control the gates of the columns which are controlled by these gates are also referred to as control signals Y1, Y2 ... Yn. A built-in cell reference circuit 5 provides reference voltages of 0, 21, and 2 volts respectively for the write, erase, and read operations. These reference voltages are supplied to the gate-controlling transistors 4 via the transistors 3, for controlling the control gates of the memory transistors.

In the circuit configuration of FIG. 2, a specific byte is identified by the cross point of the column and word line where it is located, and the byte is selected by applying a control signal to the transistors 3 and 4 corresponding to the specific byte, to make them conductive. A fundamental process to erase and to write in the memory matrix will be explained with reference to FIG. 2.

In order to "erase" a specific byte (Y1, WL1) for example, the output voltage of the cell reference circuit 5 is increased to a high voltage Vpp, and the voltage of the bit lines is kept to 0 volts. By doing so, the high voltage Vpp is applied to the control gates of the memory transistors in the specific byte (Y1, WL1), and the drain voltages of them become 0 volts. Thus, these memory transistors begin the "erase" operation, which has been previously described with respect to FIG. 1, and "1" is written in each of the memory cells of the byte (Y1, WL1).

In order to "write" the specific byte (Y1, WL1) for example, the Y-gate Y1 and the word line WL1 are selected, the output voltage of the cell reference circuit 5 is decreased to 0 volts, and the voltage of the bit lines is increased to Vpp. Then the memory transistors of the specific byte begin the "write" operation as has been described before, and "0" is written in each of the memory cells of the byte (Y1, WL1).

As previously mentioned, in order to test the programmable ROM (read only memory), a checkerboard pattern is written in the memory matrix. Each ROM device integrated in an IC (integrated circuit) is provided with contact pins corresponding to each of the data input lines, but the number of word lines is too great to provide the IC with discrete input terminals. Therefore, only one contact pin is provided for the word lines. The selection of the word lines is done by applying a code to the word pin. Then, a decoder provided in the IC selects the word line according to the code (address) allotted to each of the word lines. Therefore, it is necessary to write, one by one, the data of the checkerboard pattern in all of the bytes. For example, in a 64 k-bit memory device of 8 bits/byte, there are 8,192 memory arrays to be written. Therefore, if it takes 10 ms to write a byte, it requires approximately 82 sec. to write a checkerboard pattern in the device. This length of time, and hence the time required to test a device, increases as the memory size of the device increases. It is therefore a serious problem for manufacturers of memory devices.

Some attempts to decrease the test time have been proposed. An example is disclosed in Japanese Patent No. 56-50357, Nov. 28, 1981, by M. Higuchi et al. Higuchi et al. provides plural decoders in a device, which results in only a slight decrease in the test time.

SUMMARY OF THE INVENTION

It is a general object of the present invention to reduce the times needed to test a programmable memory device.

Another object of the present invention is to cut down the time needed to write a checkerboard pattern in a memory matrix of a programmable memory device.

A further object of the present invention is to provide a programmable memory device, especially an $E^2$-PROM, in which a checkerboard pattern can be written in a very short time.

Still another object of the present invention is to provide a programmable memory device which can be tested in a very short period of time, without increasing the number of pins beyond that of a conventional $E^2$-PROM, and which does not require a special test apparatus.

The foregoing objects can be attained by providing a PROM device with means to select either all of the word lines or every other word line, and which can simultaneously select all of the bit lines.

By providing the PROM device with these means, it becomes possible to write the checkerboard pattern with only four steps, regardless of the memory size. Each of these steps are equivalent to writing or erasing one word in an $E^2$PROM. Therefore, the writing process of the checkerboard pattern is reduced to a time equivalent to the time required to write four bytes in a memory matrix.

These together with other objects and advantages of the invention will become more apparent from the following description, reference being had to the accompanying drawings wherein like reference numerals designate the same or similar parts throughout.

BRIEF DESCRIPTION OF THE DRAWINGS

FIG. 3 is a diagram illustrating a process for writing a checkerboard pattern in a memory matrix made up of five 4-bit memory arrays, according to the present invention, wherein:

FIG. 3(A) illustrates a consequence of a step (A), in which all bits are erased and "1" is written in all of the memory cells;

FIG. 3(B) illustrates a consequence of a step (B), in which all bit lines are written alternately, "0" and "1";

FIG. 3(C) illustrates a consequence of a step (C), wherein every other word line is selected and erased; and FIG. 3(D) illustrates a consequence of a step (D), wherein every other word line is selected and the bit lines are written alternately, "1" and "0". As a result, a checkerboard pattern is completed;

DESCRIPTION OF THE PREFERRED EMBODIMENTS

Figure 3:
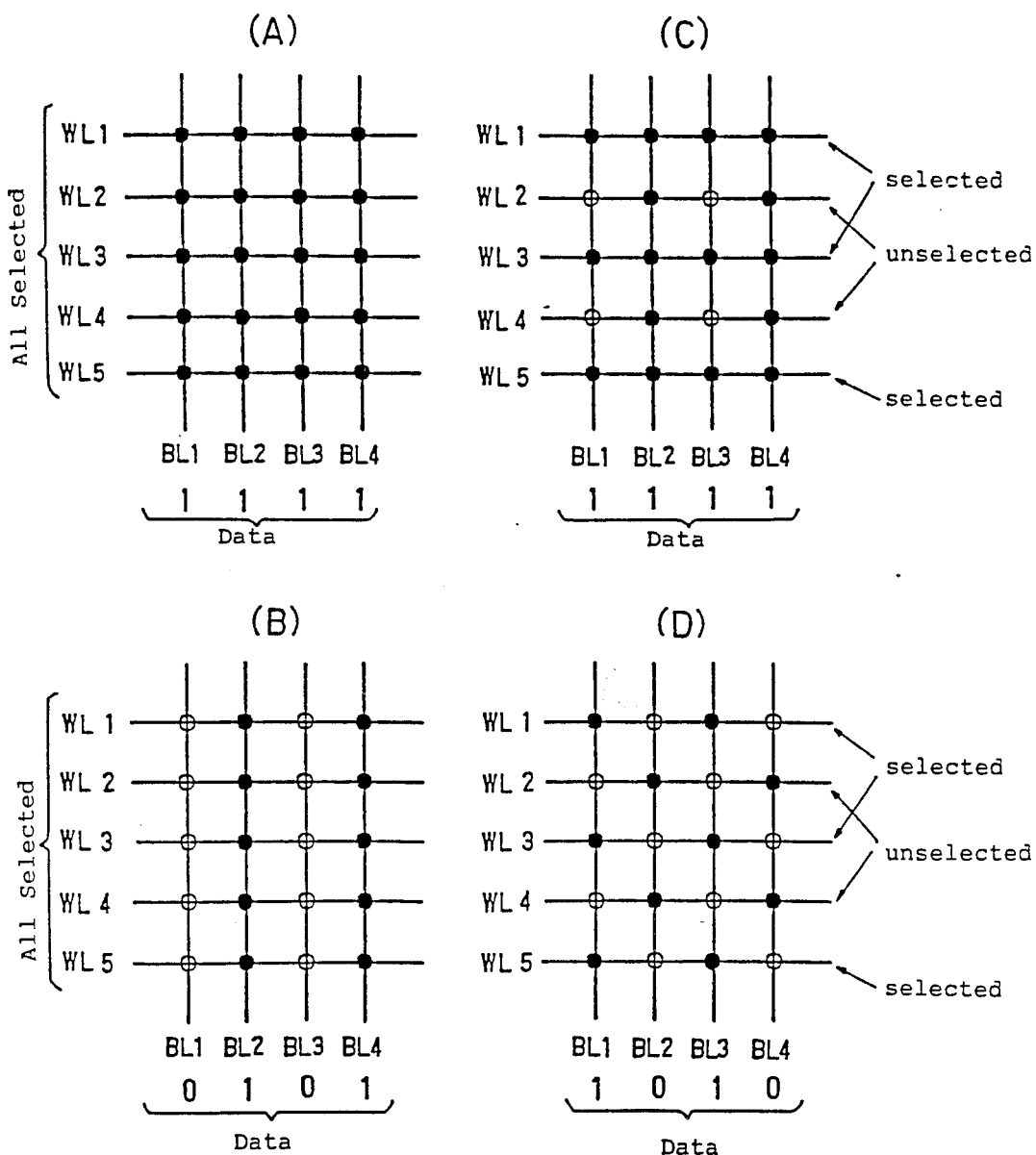

The process of writing the checkerboard pattern will be explained with reference to FIG. 3. In the process, the following steps are performed sequentially:

Step (A): Select all of the word lines WL1, WL2 . . . WL5, and select all of the bit lines BL1, BL2 . . . BL4 simultaneously. Then, erase all bits in the memory matrix, and write a data "1" into all of the memory cells. This forms the pattern of the memory matrix as shown in FIG. 3(A).

Step (B): Select all of the word lines, and write to all of the bit lines alternately "0" "1" "0" "1". This forms the pattern of the memory matrix shown in FIG. 3(B).

Step (C): Select every other word line (odd numbered lines for example), and write to all of the bit lines "1". Accordingly, the pattern of the memory matrix becomes as shown in FIG. 3(C).

Step (D): Select every other word line (odd numbered lines for example), and write to all of the bit lines an inverse data pattern of Step (B), namely "1" "0" "1" "0". Consequently, the pattern of the memory matrix becomes a checkerboard pattern as shown in FIG. 3(D).

As can be seen in the above explanation, the time required to perform each of the above steps is equivalent to the time required to write one byte to a memory device. Thus, the process time to write a checkerboard pattern in a memory matrix in a PROM device, and hence the time required to test it, is cut down considerably. The time required to perform the above-described process does not depend on the number of word lines. Thus, such a process is applicable to any programmable memory matrix, regardless of its memory size.

As has been described, the present invention provides a PROM device with a means for selecting all of the word lines, a means for selecting every other word line, and a means for simultaneously selecting all of the bit lines.

Figure 4:
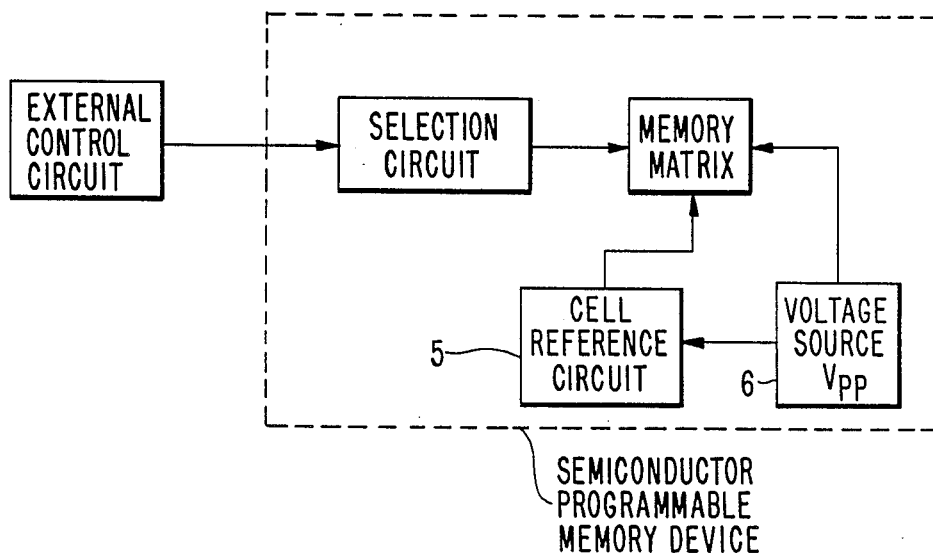
FIG. 4 is a block diagram of a programmable memory device according to the present invention.

FIG. 4 is a block diagram of a programmable memory device according to the present invention. It includes a selection circuit according to the present invention, which is discussed in detail with reference to FIG. 5.

Figure 5:
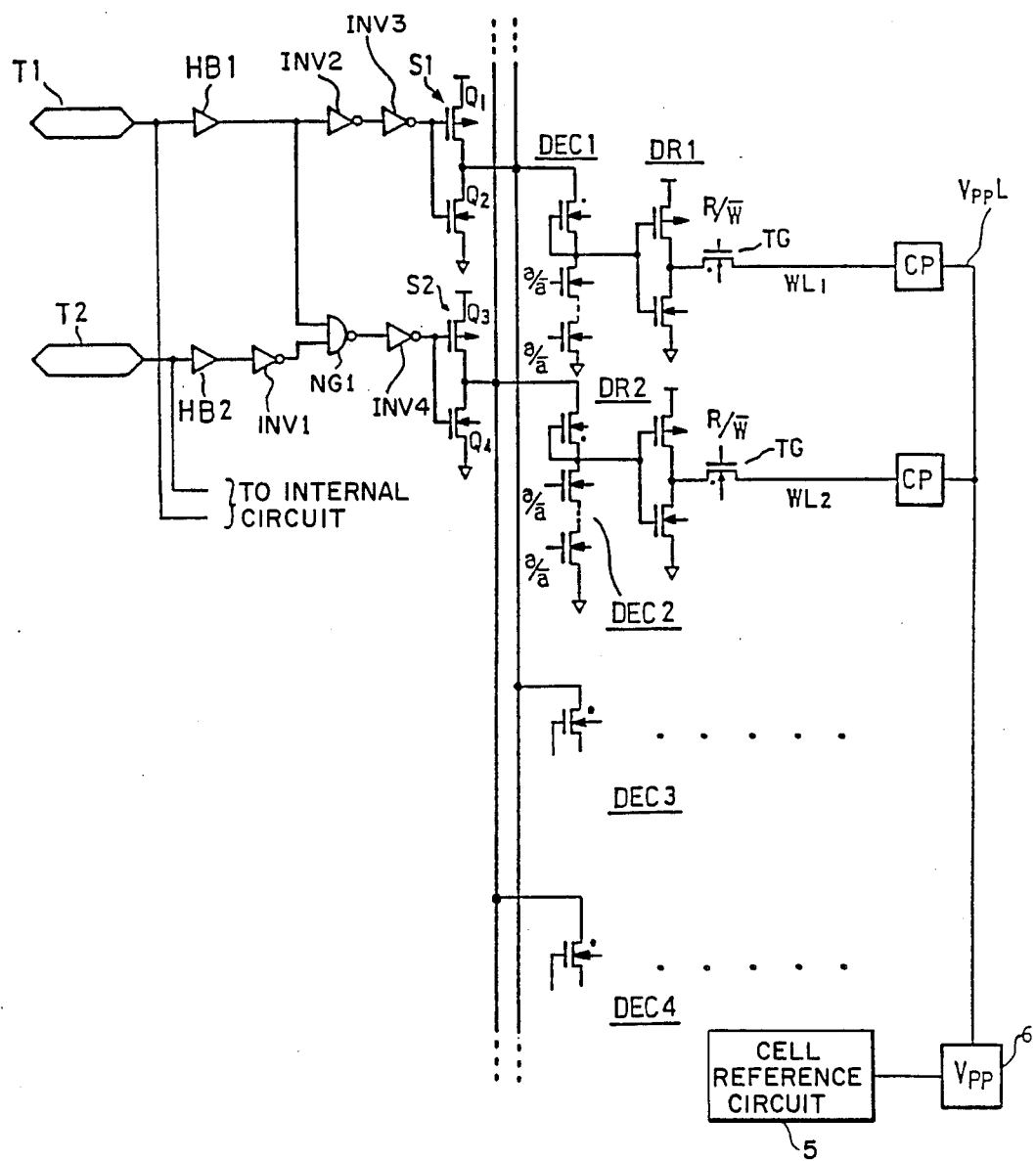
FIG. 5 is a circuit diagram of the selection circuit shown in FIG. 4 according to the present invention, which selects all of the word lines or which selects every other word line using the same circuit.

FIG. 5 is an embodiment of a selection circuit according to the present invention. This circuit performs both the function of selecting all of the word lines and of selecting every other word line, under the control of external signals.

In FIG. 5, T1 and T2 are terminals to which control signals are supplied. In normal operation of the device as a ROM, these terminals can be used as input or output terminals for other signals. Therefore, this circuit may be added to an E$^2$PROM device without the need for additional input terminals. High voltage detection circuits HB1 and HB2 enable the terminals T1 and T2 to be used for both the selection circuit operation and for the normal ROM operation. The output of high voltage detection circuit HB1 is fed to a switch S1 via inverters INV2 and INV3, and the output of high voltage detection circuit HB2 is inverted by an inverter INV1, and fed to one input terminal of a NAND gate NG1. Another input terminal of NAND gate NG1 is connected to the output terminal of high voltage detection circuit HB1. The output of NAND gate NG1 is fed to a switch S2 via an inverter INV4.

Switches S1 and S2 are each composed of a CMOS (complementary MOS) inverter circuit, wherein Q1, Q3 are p-channel FETs, and Q2, Q4 are n-channel FETs. The switches S1 and S2 respectively form a voltage source switch for odd numbered decoder circuits DEC1, DEC3 . . . and even numbered decoders DEC2, DEC4 . . . . Driver circuits DR1, DR2 . . . are each formed by a CMOS inverter, and are respectively connected to the decoders DEC1, DEC2 . . . . Transfer gates TG are provided between each decoder and its corresponding word line. They are composed of depletion type n-channel FETs, the gates of which are supplied with a high voltage control signal for a read operation, and a low voltage control signal for a write operation. In the figure, R/$\overline{\text{W}}$ indicates such a control signal. The depletion transistors are identified by a small dot next to the symbol of an FET. The decoders are controlled by signal a and $\overline{\text{a}}$. The operations of these elements are conventional, and further description is omitted for the sake of simplicity.

As can be seen in FIG. 5, word lines are respectively connected to respective transfer gates TG. Each of the word lines is provided with a charge pump CP which increases the voltage Vpp. The charge pumps CP are similar to those used in an ordinary E$^2$PROM. The high voltage Vpp (21 volts for example) is supplied from a voltage source 6. The voltage Vpp is also fed to the cell reference circuit 5.

Figure 6:
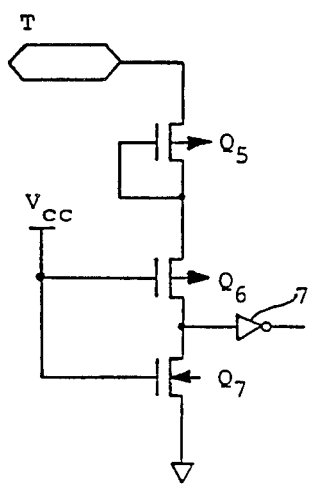
FIG. 6 is a circuit diagram of an example of a high voltage detector circuits of FIG. 5.

There are various high voltage detection circuits which can be used as the high voltage detection circuits HB1 and HB2 of FIG. 5, of which a simple and effective one is shown in FIG. 6, as an example. The circuit is composed of series connected FETs, Q5, Q6 and Q7. Among them, Q5 and Q6 are p-channel FETs and Q7 is an n-channel FET. The gate of Q5 is connected to its drain, so Q5 is always conductive and is equivalent to a low value resistor. The gates of Q6 and Q7 are connected to each other and supplied with a source voltage Vcc (5 volts for example). In normal operation of the device, the voltage supplied to the input terminal T has a range of 0 to 5 volts. In such a voltage range, Q6 is in the OFF state and Q7 is in the ON state, since their gates are supplied with Vcc. Thus, no signal appears at the output terminal of the inverter 7, and the output of the inverter is kept at a "HIGH" level. If the voltage of the input terminal T is increased to be greater than Vcc, Q6 becomes conductive, and Q7 is still in the ON state. Accordingly, the output of the inverter 7 becomes a "LOW" level.

In normal memory operation, the terminals T1 and T2 in FIG. 5 are supplied with signals having a voltage range of 0 to 5 volts, so that the high voltage detection circuits HB1 and HB2 do not operate. Accordingly, the input signals to the switches S1 and S2 are "LOW", and their outputs become "HIGH". Thus, all of the decoders are supplied with normal source voltage, and they operate normally. The input signals to the terminals T1 and T2 are sent to an internal circuit, such as an address buffer, and the device operates as a normal ROM circuit.

In order to select all of the word lines, the voltage of the terminal T1 is increased to a high voltage, that is, more than Vcc, and the voltage of the terminal T2 is kept in a normal voltage range (0–5 volts). This causes the input of the switches S1 and S2 to become "HIGH", and therefore, their output becomes "LOW". The voltage source of all of the decoders becomes "LOW", and their outputs also become "LOW". Accordingly, all inputs of the drivers become "LOW, and their outputs become "HIGH". Thus, all of the word lines are selected.

In order to select every other word line, the voltages supplied to both terminals T1 and T2 are increased to a voltage higher than Vcc. Then the input of switch S1 becomes "HIGH" and the input of the switch S2 becomes "LOW". Thus, all the decoders connected to S1 are selected, all of the odd numbered word lines (in this example) are selected, and all of the decoders connected to S2 are not selected. At this time, since the output of the switch S2 is "HIGH", all of the decoders connected to S2, and hence the even numbered word lines, are in an enable state and are operable by signals to the decoders.

Figure 1:
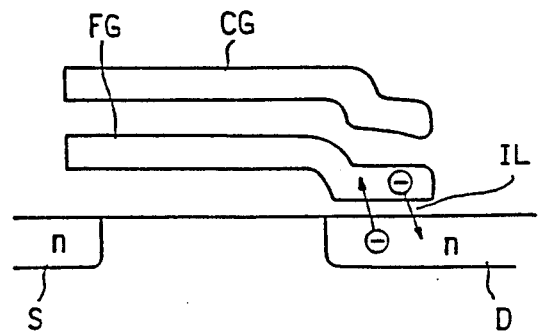
FIG. 1 is a schematic cross-sectional view of a prior art floating gate type memory transistor according to the present invention.
Figure 2:
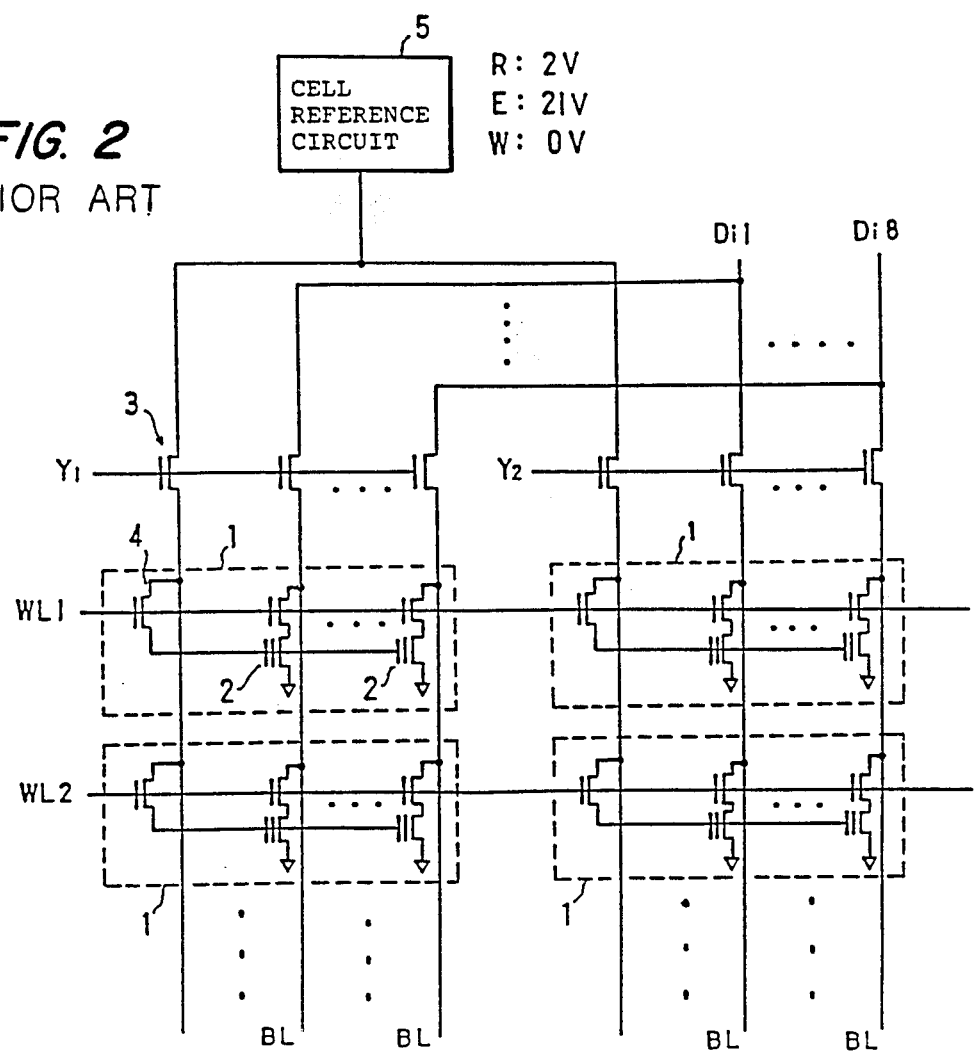
FIG. 2 is a circuit diagram of a programmable memory device for illustrating a process relevant to the present invention.

The above process has been described with respect to word lines. But it is clear that the word lines in FIG. 5 may be replaced by bit lines. Therefore, the circuit of FIG. 5 is capable of selecting all of the bit lines, or selecting every other bit line. It should be pointed out that, as can be seen in FIG. 2, the bit lines BL are connected in parallel to all of the columns of the memory arrays, so the selection should be performed on the data input lines Di1, Di2 . . . , after selecting all of the Y-gates Y1, Y2 . . . . However, since the data input lines are provided with discrete input terminals, the selection may be done by an external test circuit. Therefore, the circuit of FIG. 5 is applicable to select all of the Y-gates at the same time.

It is unnecessary to provide another selection circuit like that of FIG. 5 exclusively for the bit lines. It is clear that the selection of Y-gates can be done with the same circuit designed for the word lines, because all of the Y-gates should be selected at every step of the process described with respect to FIG. 3. So, if the lines of Y1, Y2 . . . are connected to the switch S1 in a manner similar to the connection of the word lines, they will be selected every time the word lines are selected.

Next, the process of writing a checkerboard pattern as has been described with respect to FIG. 3 will be explained with reference to FIG. 5. The process performs the following four steps sequentially:

Step (A): Apply a voltage higher than Vcc to the terminal T1, and apply to all of the data input lines a datum "1". Thus, all bits are erased and a datum "1" is stored in all memory cells. The pattern of the data matrix becomes as shown in FIG. 3(A).

Step (B): Apply Vpp to terminal T1, and apply to the data input lines alternately the data "0" "1" "0" "1". The pattern of the memory matrix will become as shown in FIG. 3(B).

Step (C): Apply Vpp to terminals T1 and T2, and apply to all of the data input lines a datum "1". Then the pattern of the memory matrix will become as shown in FIG. 3(C).

Step (D): Apply Vpp to the terminals T1 and T2, and apply to all of the data input lines alternately the inverse data pattern of step (B), "1" "0" "1" "0". Consequently, a checkerboard pattern like FIG. 3(D) is written in the memory matrix.

The above disclosure has been described with respect to a memory array in which the memory cells are composed of a memory transistor and an FET. However, the invention is not restricted to such a device, and it can be applied to any type of memory matrix. The selection circuit described with respect to FIG. 5 is an example of a PROM which can select either all of the word lines or every other word line utilizing the same circuit, which enables the writing of a checkerboard pattern in a memory matrix with only four steps regardless of the bit size of the memory device. Various modifications of the circuit are possible, and the embodiment described in the disclosure is not a restrictive one.

What is claimed is:

1. A semiconductor programmable memory device having a plurality of word lines and a plurality of bit lines in which a checkerboard pattern is written in a memory matrix for checking its operation, said device comprising:
   first means for selecting all of the word lines at the same time;
   second means for selecting all of the bit lines at the same time; and
   third means for selecting alternate word lines at the same time.

2. A semiconductor programmable memory device, comprising:
   a plurality of word lines;
   a plurality of bit lines intersecting said word lines, each intersection of said lines identifying a particular byte location; and
   means for selecting a particular byte location, said means for selecting a particular byte location including:
   means for selecting all of said word lines at the same time.

3. A semiconductor programmable memory device according to claim 2, wherein said means for selecting a particular byte location further includes:
   means for selecting only every other word line at the same time.

4. A semiconductor programmable memory device according to claim 3, wherein said means for selecting a particular byte location further includes:
   means for selecting all of said bit lines at the same time.

5. A semiconductor programmable memory device according to claim 4, wherein said memory device is coupled to an external control source, said means for selecting a particular byte location further including:
   first and second input terminals for receiving first and second control signals, respectively, from the external control source;
   a first high voltage detection circuit coupled to said first input terminal;
   a second high voltage detection circuit coupled to said second input terminal;
   first switch means coupled to said first high voltage detection circuit;
   second switch means coupled to said second high voltage detection circuit;
   a plurality of decoder/driver circuits each having an input and an output, said first switch means being connected to the input of every other decoder/driver circuit, said second switch means being connected to the input of the remaining decoder/driver circuits, and said plurality of word lines being respectively connected to the outputs of said plurality of decoder/driver circuits, so that when the first control signal is above a predetermined voltage and the second control signal is below the predetermined voltage, said means for selecting a particular byte location selects all word lines at the same time, and
   when the first and second control signals are above the predetermined voltage, said means for selecting a particular byte location selects only every other word line at the same time.

6. A semiconductor programmable memory device according to claim 5, wherein said first switch means includes a first voltage source switch coupled to said high voltage detection circuit.

7. A semiconductor programmable memory device according to claim 6, wherein said second switch means includes a second voltage source switch coupled to said second high voltage detection circuit.

8. A semiconductor programmable memory device according to claim 7, wherein said second switch means further includes:
   inverting means having an input and output coupled to said second high voltage detection circuit; and
   a NAND gate having a plurality of inputs and an output, the output of said inverter coupled to one of said inputs of said NAND gate, and the output of said first high voltage detection circuit coupled another of said NAND gate inputs, said second voltage source switch being coupled to the output of said NAND gate.

9. A semiconductor programmable memory device according to claim 8, wherein said first voltage source switch means is further coupled to said plurality of bit lines, so that when the first control signal is higher than the predetermined voltage, all of said bit lines are selected at the same time.

10. A semiconductor programmable memory device according to claim 9, wherein said memory device is a PROM.

11. A semiconductor programmable memory device according to claim 9, wherein said memory device is an E²PROM.

12. A method of writing a checkerboard pattern in a memory matrix of a semiconductor programmable memory device having a plurality of word lines and a plurality of bit lines, comprising the following steps in sequence:
   (a) selecting all of the word lines and all of the bit lines at the same time, then erasing all bits in said memory matrix, and writing data of a first logic level to all of the memory cells;
   (b) selecting all of the word lines at the same time, and writing to all of the bit lines alternately data of a second logic level and data of the first logic level;
   (c) selecting alternate word lines simultaneously, and writing data of the first logic level to all of the bit lines; and
   (d) selecting every other word line simultaneously, and writing to all of the bit lines the inverse data pattern of step (b).

* * * * *

UNITED STATES PATENT AND TRADEMARK OFFICE
CERTIFICATE OF CORRECTION

PATENT NO. : 4,744,058

DATED : May 10, 1988

INVENTOR(S) : Kawashima et al.

It is certified that error appears in the above-identified patent and that said Letters Patent is hereby corrected as shown below:

Col. 8, line 65, change "every other" to --alternate--;

change "line" to --lines--.

Signed and Sealed this

Twentieth Day of September, 1988

*Attest:*

DONALD J. QUIGG

*Attesting Officer*   *Commissioner of Patents and Trademarks*